United States Patent
Powell et al.

(10) Patent No.: US 7,931,937 B2
(45) Date of Patent: *Apr. 26, 2011

(54) SYSTEM AND METHOD FOR DEPOSITING A MATERIAL ON A SUBSTRATE

(75) Inventors: Ricky Charles Powell, Ann Arbor, MI (US); Andrew Kelly Gray, Perrysburg, OH (US); Todd Alden Coleman, Wayne, OH (US)

(73) Assignee: First Solar, Inc., Perrysburg, OH (US)

( * ) Notice: Subject to any disclaimer, the term of this patent is extended or adjusted under 35 U.S.C. 154(b) by 510 days.

This patent is subject to a terminal disclaimer.

(21) Appl. No.: 11/380,095

(22) Filed: Apr. 25, 2006

(65) Prior Publication Data

US 2006/0236940 A1    Oct. 26, 2006

Related U.S. Application Data

(60) Provisional application No. 60/674,683, filed on Apr. 26, 2005.

(51) Int. Cl.
*C23C 16/00* (2006.01)
*H01L 21/20* (2006.01)

(52) U.S. Cl. ............... 427/248.1; 118/719; 118/726

(58) Field of Classification Search ............... None
See application file for complete search history.

(56) References Cited

U.S. PATENT DOCUMENTS

| | | | |
|---|---|---|---|
| 3,858,548 A * | 1/1975 | Tick | 118/724 |
| 3,954,423 A * | 5/1976 | Hamper et al. | 48/107 |
| 3,966,127 A * | 6/1976 | Pytlewski | 241/73 |
| 4,512,868 A * | 4/1985 | Fujimura et al. | 204/298.38 |
| 4,606,776 A * | 8/1986 | Salis | 134/36 |
| 4,987,284 A * | 1/1991 | Fujimura et al. | 219/121.43 |
| 5,248,349 A * | 9/1993 | Foote et al. | 136/260 |
| 5,445,973 A | 8/1995 | Hedström | |
| 5,837,320 A | 11/1998 | Hampden-Smith et al. | |
| 5,994,642 A | 11/1999 | Higuchi et al. | |
| 6,037,241 A * | 3/2000 | Powell et al. | 438/479 |
| 6,444,043 B1 * | 9/2002 | Gegenwart et al. | 118/726 |
| 6,660,328 B1 * | 12/2003 | Dahmen et al. | 427/248.1 |
| 2002/0129769 A1 * | 9/2002 | Kim et al. | 118/723 E |
| 2004/0031442 A1 * | 2/2004 | Yamazaki et al. | 118/727 |

OTHER PUBLICATIONS

Salis, US Patent 4,606,776, Derwent abstract, Aug. 1996.*
U.S. Appl. No. 11/380,073, Office Action dated Nov. 7, 2008.
U.S. Appl. No. 11/380,088, Office Action dated Nov. 7, 2008.
U.S. Appl. No. 11/380,079, Office Action dated Nov. 10, 2008.

* cited by examiner

*Primary Examiner* — Timothy H Meeks
*Assistant Examiner* — Joseph Miller, Jr.
(74) *Attorney, Agent, or Firm* — Dickstein Shapiro LLP

(57) ABSTRACT

A method and apparatus for depositing a film on a substrate includes introducing a material and a carrier gas into a heated chamber. The material may be a semiconductor material, such as a cadmium chalcogenide. A resulting mixture of vapor and carrier gas containing no unvaporized material is provided. The mixture of vapor and carrier gas are remixed to achieve a uniform vapor/carrier gas composition, which is directed toward a surface of a substrate, such as a glass substrate, where the vapor is deposited as a uniform film.

7 Claims, 8 Drawing Sheets

SYSTEM AND METHOD FOR DEPOSITING A MATERIAL ON A SUBSTRATE

CLAIM OF PRIORITY

This application claims priority under 35 U.S.C. §119(e) to U.S. Provisional Patent Application Ser. No. 60/674,683 filed Apr. 26, 2005, the entire contents of which is hereby incorporated by reference.

TECHNICAL FIELD

The present invention relates to photovoltaic device production.

BACKGROUND

In the manufacture of a photovoltaic device, semiconductor material is deposited on a glass substrate. This may be accomplished by vaporizing the semiconductor and directing the vaporized semiconductor towards the glass substrate surface, such that the vaporized semiconductor condenses and is deposited on the glass, forming a solid semiconductor film.

SUMMARY

In general, a method and system for depositing a semiconductor material on a substrate includes introducing a material and a carrier gas into a distributor assembly having a heated first chamber to form a vapor of the material. The material can be a powder, for example, a powder of a semiconductor material. The carrier gas and vapor are then directed through a series of successive heated chambers to form a uniform vapor/carrier gas composition. The uniformity of the gas composition can be provided by flow and diffusion of the vapor and gas incident to passing the vapor and gas through a plurality of chambers of the distributor assembly. After the composition has become uniform, it is directed out the distributor assembly and towards a substrate, causing a film to be formed on a surface of substrate. The substrate can be a glass substrate or another suitable substrate such as polymer substrate having a surface suitable for forming a uniform film. The film can be a semiconductor composition. The vapor and carrier gas composition may be passed through a filter after being introduced into the distributor assembly in order to ensure that solid particles of that material are not directed toward the substrate. Advantageously, the method and system for depositing a semiconductor material provides a semiconductor film with improved film thickness uniformity and grain structure uniformity.

In one aspect, a method for depositing a film on a substrate includes directing a powder such as cadmium sulfide or cadmium telluride and an inert carrier gas such as helium through a feed tube into a heated distributor assembly including a network of sequentially connected chambers. The distributor assembly may include a plurality of successively shrouded tubes such that the semiconductor powder and inert gas are introduced through a feed tube into a first heated tube the interior of which is passably connected to the interior of a second chamber. The first heated tube is heated such that the semiconductor powder forms a vapor. The vapor and carrier gas are then directed from the first heated tube to the second chamber, which may itself be a heated tube, and which may be a heated tube larger than the first heated tube and provided such that the first heated tube is disposed within the second tube.

Movement of the vapor and carrier gas through passages between successive chambers of the distributor assembly and movement within the chambers themselves can create a flow which results in a uniform mixing of vaporized semiconductor and inert carrier gas. Additionally, passing the vapor and carrier gas through multiple heated chambers can require the vapor to travel a greater distance to the substrate and can allow more time for the powder to completely vaporize. The method also includes passing the vapor and carrier gas between external heater tubes when directing the vapor towards a surface of a substrate. Passing the vapor and carrier gas between external heater tubes maintains the vapor in a temperature sufficient to keep the vapor in a vaporized state until the vapor contacts the substrate, which is maintained at a lower temperature at which the vapor condenses and is deposited as a film on a surface of the substrate.

The method may also include passing the vapor through a filter or other barrier permeable to vapor but not to powder to ensure that no powder is deposited on a surface of the substrate. Reducing or substantially eliminating the amount of powder from the vapor/carrier gas composition and providing a uniform vapor/carrier gas composition results in a deposited film that is substantially uniform as to both thickness and grain structure, resulting in higher-quality and lower-cost production.

In another aspect, a system for depositing a material on a substrate includes a heated distributor assembly having a plurality of sequentially connected chambers into which a powder and a carrier gas are introduced. The system includes a feed tube through which the powder and carrier gas are introduced into the first chamber of the distributor assembly. The distributor assembly may be heated by applying a current across one or more chambers included in the distributor assembly, or by another means that will heat at least a portion of the distributor assembly to a temperature sufficient to form a vapor from the powder. A heating element may be provided in the first chamber. One or more chambers in the distributor assembly may be heated in order to heat at least a portion of the distributor assembly. The system may also include a filter or other barrier permeable to vapor but not powder to substantially prevent powder from exiting the distributor assembly and being deposited on a surface of a substrate. The filter may be positioned within the first chamber.

The chambers in the distributor assembly are provided such that the vapor and carrier gas travel within each chamber and from each chamber to a successive chamber. A second chamber is provided proximate to the first chamber where the powder and carrier gas is introduced to the distributor assembly. After the powder is vaporized in the first chamber, it is directed into the proximate second chamber. The chambers included in the distributor assembly may be provided as a plurality of successively shrouded tubes such that the vapor and carrier gas are introduced into a first chamber which is a tube disposed within (e.g., shrouded by) another tube. The shrouded tube includes one or more apertures through which the vapor and carrier gas are directed from the shrouded tube to the shroud tube.

The distributor assembly may also include non-tubular chambers used in connection with tubular chambers or other non-tubular chambers. Additionally, the distributor assembly may be designed such that the vapor and carrier gas are directed from one chamber to the next through a passageway and not necessarily immediately through an aperture in a shrouded chamber into the interior of a shrouding chamber. Regardless of the specific configuration of the distributor assembly, the distributor assembly can provide a flow pattern for the vapor and carrier gas such that a uniform vapor/carrier gas composition is obtained as the vapor and carrier gas are directed within each chamber and between the chambers included in the distributor assembly. An outlet can be provided at the end of the distributor assembly and is positioned such that the uniform vapor/carrier gas composition directed through the distributor assembly and outlet is directed toward a surface of a substrate upon which the semiconductor is deposited as a film on a surface of the substrate. The outlet may be positioned proximate to the second chamber. Where the last chamber through which the vapor/carrier gas composition can be directed can be a tube, the outlet may be a slot oriented along the length of the tube. The outlet may also include a manifold having a plurality of orifices through which the vapor and carrier gas are directed toward the substrate.

The distributor assembly also includes external heater tubes proximate to the outlet. When the vapor and carrier gas pass between these external heaters, the vapor is maintained at a sufficient temperature to keep the vapor in a vapor states until it contacts a surface of the substrate, which is maintained at a lower temperature, causing the vapor to condense and be deposited on a surface of the substrate as a film.

The substrate upon which the film is deposited can be introduced in the proximity of the distributor assembly outlet by a conveyor system. The conveyor system may include a gas hearth for supporting and transporting a plurality of substrates past the distributor assembly outlet for deposition.

The method and system described here have the advantage over known systems and methods of depositing a semiconductor film on a substrate of providing a film of uniform thickness and grain structure. These properties can be important, particularly with respect to the use of semiconductor films in solar panels. The method and system described here also provide improved definition of the film deposition area, resulting in higher material utilization. As a result, the method and system described result in higher efficiency in the production of solar panels than is provided with known methods and systems.

The method can provide a material film having a uniform thickness and composition. A solid introduced into the system can be maintained at a temperature sufficient to vaporize the material for a duration of time sufficient to ensure that substantially all the material that is passed through the system forms a vapor. Additionally, a solid to be vaporized and a carrier gas introduced into the system are passed through the system in such a manner that the vapor and the carrier gas mix to form and maintain a uniform composition; segregation between the vapor and the carrier gas which can occur when passing through a permeable structure such as a filter on account of the difference in molecular weight between the vapor and carrier gas is substantially reduced.

The details of one or more embodiments are set forth in the accompanying drawings and the description below. Other features, objects, and advantages will be apparent from the description and drawings, and from the claims.

DETAILED DESCRIPTION

An apparatus and method for depositing a semiconductor film on a glass substrate are described, for example, in U.S. Pat. No. 6,037,241, the disclosure of which is herein incorporated by reference in its entirety.

A solid material such as a semiconductor powder and carrier gas can be introduced into a heated permeable tubular chamber, where the solid material is vaporized. The vapor and carrier gas then pass through the walls of the heated permeable chamber into a shroud surrounding the chamber. The shroud can include an opening through which the vapor is directed toward a surface of a substrate, such as a glass substrate, where it is deposited as a film.

Figure 1:
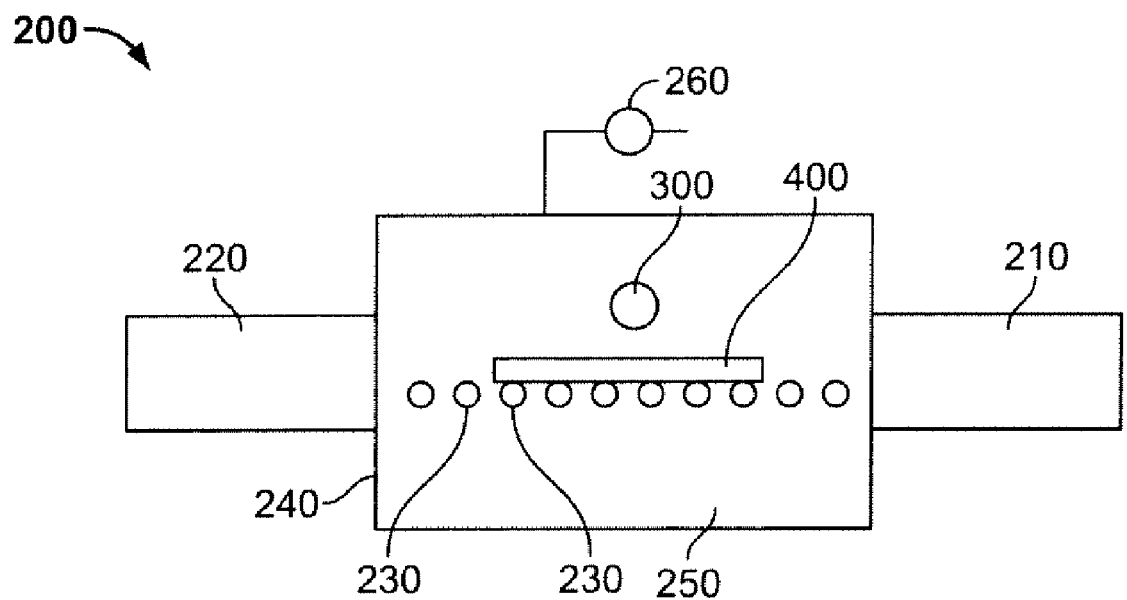
FIG. 1 is a drawing depicting a system for depositing a semiconductor on a glass sheet substrate.

With reference to FIG. 1 of the drawings, a substrate processing system 200 includes distributor assembly 300. Both the distributor assembly 300 and the method for processing a substrate 400 are described and exemplified here.

With continuing reference to FIG. 1, the system 200 includes a housing 240 defining a processing chamber 250 in which a material is deposited on a substrate 400. Substrate 400 can be a glass sheet. Housing 240 includes an entry station 210 and an exit station 220. Entry station 210 and exit station 220 can be constructed as load locks or as slit seals through which substrate 400 enters and exits the processing chamber 250. The housing 240 can be heated in any suitable manner such that its processing chamber can be maintained at a deposition temperature. The distributor temperature can be 500 degrees to 1200 degrees C. Substrate 400 can be heated during the processing to a substrate temperature. The substrate temperature can be 200 degrees to 650 degree C. Substrate 400 can be transported by any appropriate means such as rollers 230, or a conveyor belt, preferably driven by an attached electric motor.

Figure 2:
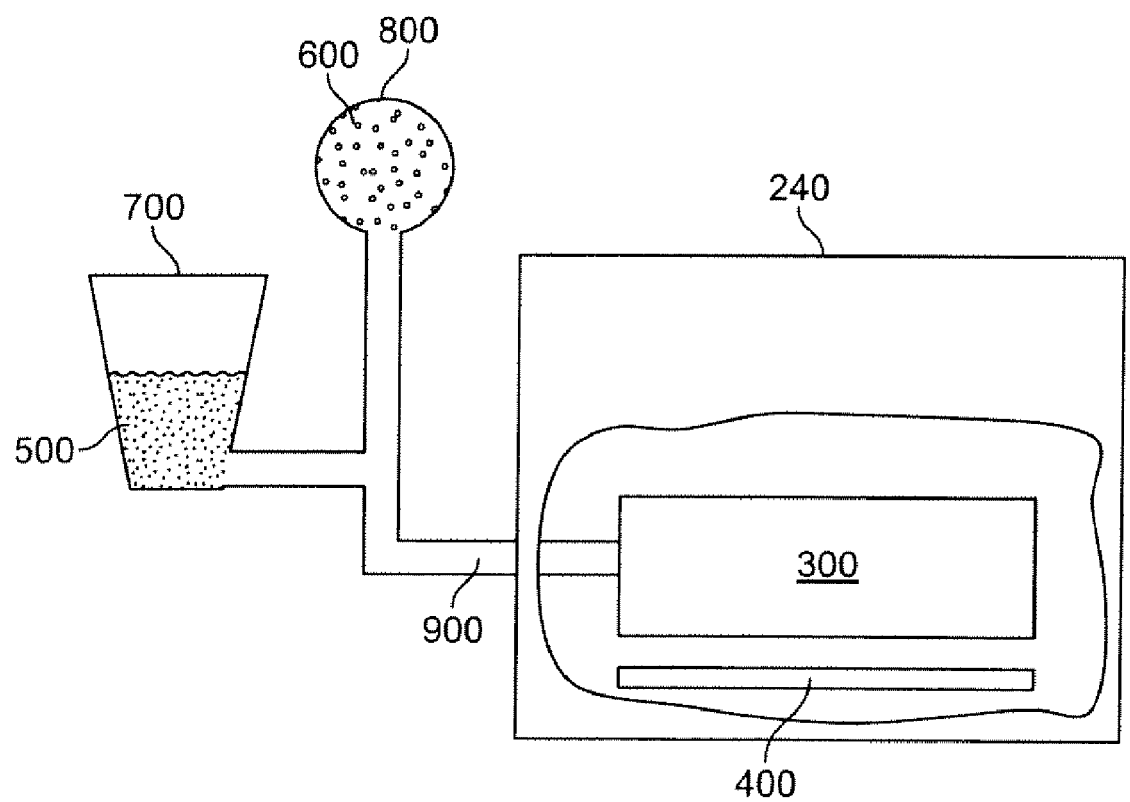
FIG. 2 is a drawing depicting a material supply for introducing a semiconductor powder and a carrier gas into a distributor assembly.

With reference to FIG. 2, distributor assembly 300 contained in housing 240 is connected by feed tube 900 to a material supply, which can include a hopper 700 containing a powder 500 and a carrier gas source 800 containing an appropriate carrier gas 600. Powder 500 can contact carrier gas 600 in feed tube 900, and both carrier gas 600 and powder 500 are introduced into distributor assembly 300.

After carrier gas 600 and powder 500 are introduced into distributor assembly 300, powder 500 is vaporized and directed through distributor assembly 300 along with carrier gas 600 in such a manner that carrier gas 600 and the vapor are mixed to form a uniform vapor/carrier gas composition. The uniform vapor/carrier gas composition is then directed out of distributor assembly 300 toward substrate 400. The lower temperature of substrate 400 compared to the temperature in distributor assembly 300 in order to maintain the material in vapor phase, causes condensation of the vapor on a surface of substrate 400, and the deposition of a film, which has a substantially uniform thickness and a substantially uniform structure demonstrating a uniform crystallization and a substantial absence of particulate material, such as unvaporized powder.

The exit point of the semiconductor vapor from distributor assembly 300 can be spaced from substrate 400 at a distance in the range of about 0.5 to about 5.0 cm to provide more efficient deposition. While greater spacing can be utilized, that may require lower system pressures and would result in material waste due to overspraying. Furthermore, smaller spacing could cause problems due to thermal warpage of substrate 400 during conveyance in the proximity of the higher temperature distributor assembly 300. Substrate 400 can pass proximate to the point where the semiconductor vapor exists distributor assembly 300 at a speed of at least about 20 mm per second to about 40 mm per second.

In performing the deposition, successful results have been achieved using cadmium telluride and cadmium sulfide as the material. However, it should be appreciated that other materials can be utilized which include a transition metal (Group IIB) and a chalcogenide (Group VIA). It should be further appreciated that additional materials that can be utilized to form a semiconductor film have many useful applications (such as the manufacture of photovoltaic devices) and may be used with the present invention. Also, dopants may be useful to enhance the deposition and properties of the resulting film.

Use of system 200 to perform the method of the invention has been performed with a vacuum drawn in the processing chamber 250 to about 0.5 to 760 Torr. In that connection, as illustrated in FIG. 1, the processing system 200 includes a suitable exhaust pump 260 for exhausting the processing chamber 250 of the housing 240 both initially and continuously thereafter to remove the carrier gas.

The carrier gas 600 supplied from the source 800 can be helium, which has been found to increase the glass temperature range and the pressure range that provide film characteristics such as deposition density and good bonding. Alternatively, the carrier gas can be another gas such as nitrogen, neon, argon or krypton, or combinations of these gases. It is also possible for the carrier gas to include an amount of a reactive gas such as oxygen that can advantageously affect growth properties of the material. A flow rate of 0.3 to 10 standard liters per minute of the carrier gas has been determined to be sufficient to provide the material flow to distributor assembly 300 for deposition on a substrate.

Figure 3:
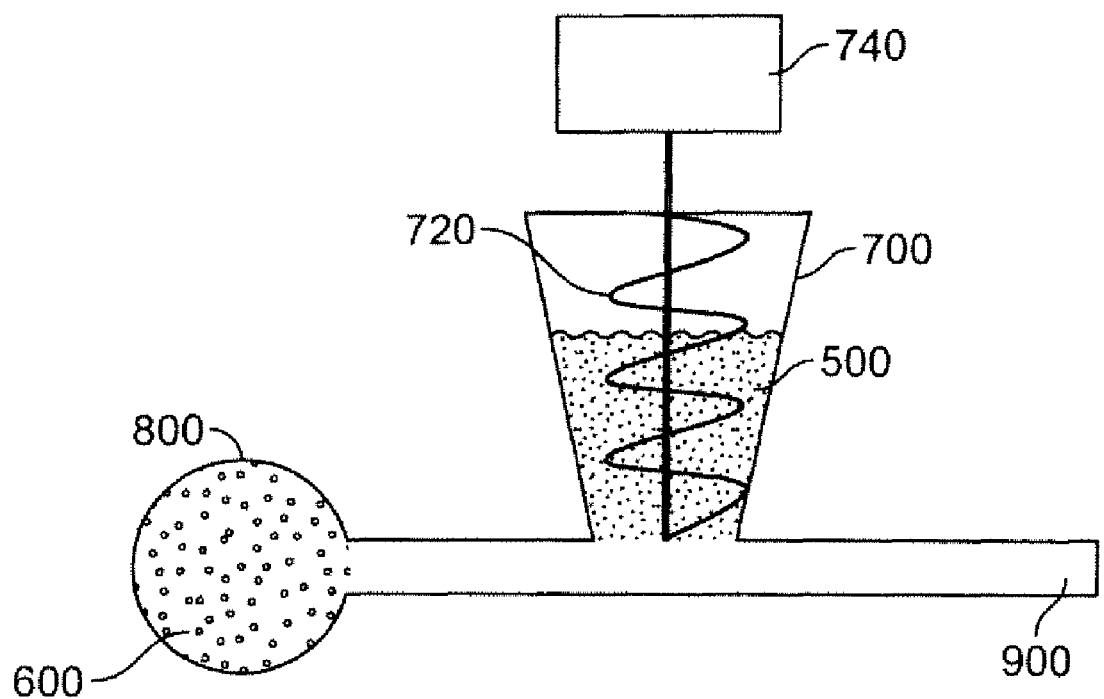
FIG. 3 is a drawing depicting an embodiment of a material supply.
Figure 4:
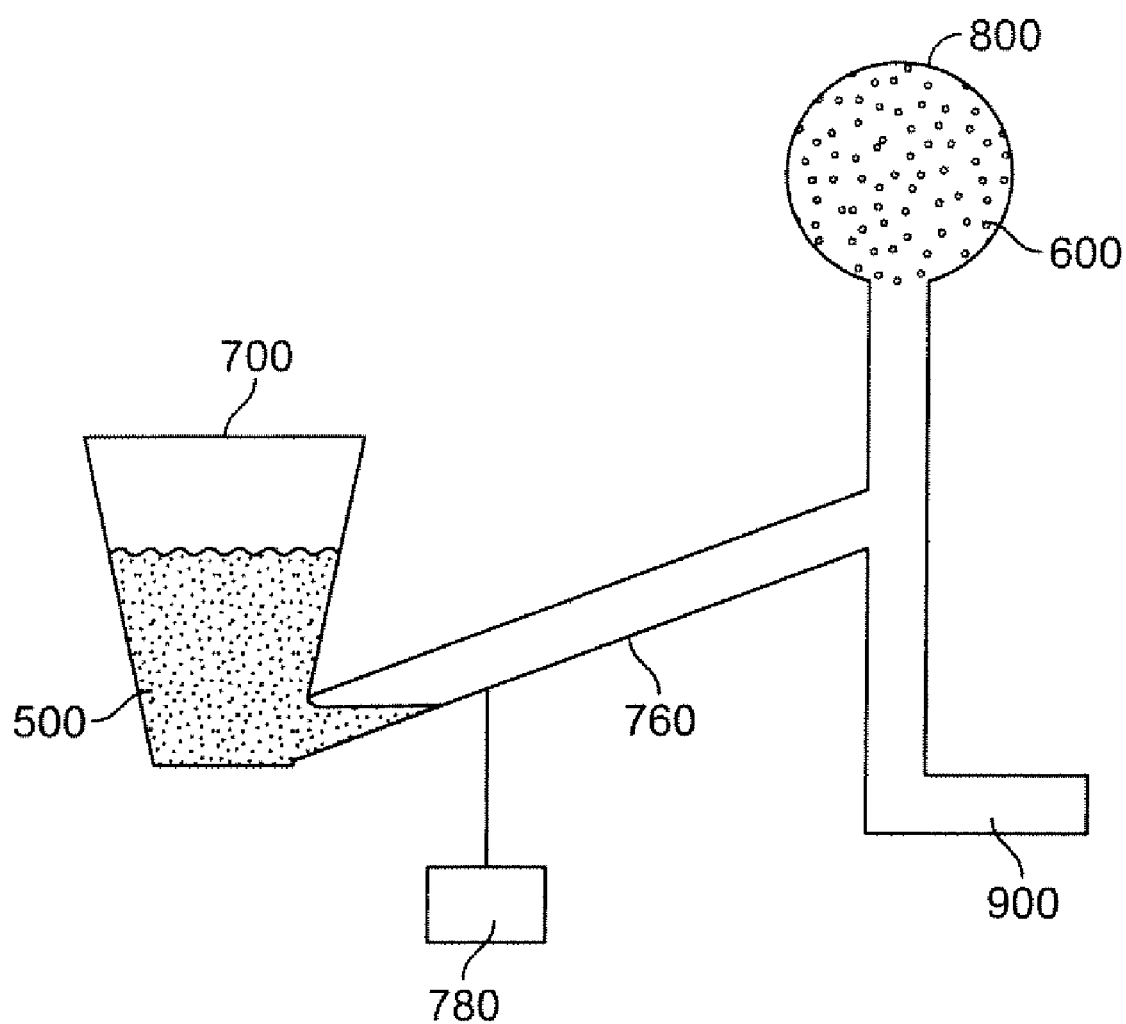
FIG. 4 is a drawing depicting an alternate embodiment of a material supply in accordance with the present invention.

It should be recognized that multiple material supplies having multiple hopper and multiple carrier gas sources may introduce carrier gas and material into the distributor assembly. A single material supply is shown in FIG. 2 and subsequent figures for the sake of clarity. FIG. 3 and FIG. 4 depict alternate embodiments of a material supply which can be used. As shown in FIG. 3, hopper 700 containing powder 500 may include a rotary screw 720, which, when rotated by actuator 740 delivers powder 500 into feed tube 900, where it is introduced into carrier gas 600 delivered from carrier gas source 800. Alternatively, as shown in FIG. 4, a vibration-actuated material source is depicted, in which a vibration introduced by vibratory feeder 780 causes powder 500 to incrementally move from hopper 700 into inclined passage 760. In this manner, powder is introduced into feed tube 900, along with carrier gas 600 from carrier gas source 800.

Figure 5:
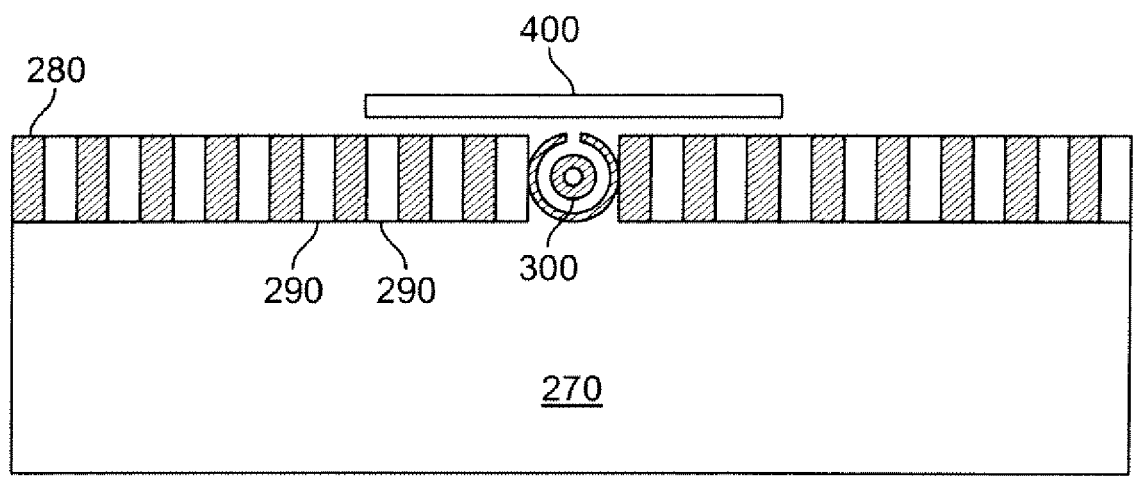
FIG. 5 is a drawing depicting an embodiment of a system for depositing a semiconductor on a downward-facing surface of a glass sheet substrate.

FIG. 5 represents an alternative embodiment of system 200 in which a semiconductor film may be deposited on a downward-facing surface of substrate 400. The alternate system depicted includes a refractory hearth 280 above a plenum 270 of heated pressurized gas. Holes 290 in hearth 280 provide for upward flow of the pressurized heated gas so as to support glass substrate 400 in a floating manner. As floating glass substrate 400 is conveyed along the length of hearth 280, the downward-facing surface passes proximate to distributor assembly 300, from which semiconductor vapor is directed toward and deposited as a film on substrate 400.

Various embodiments of distributor assembly 300 are described below.

Figure 6:
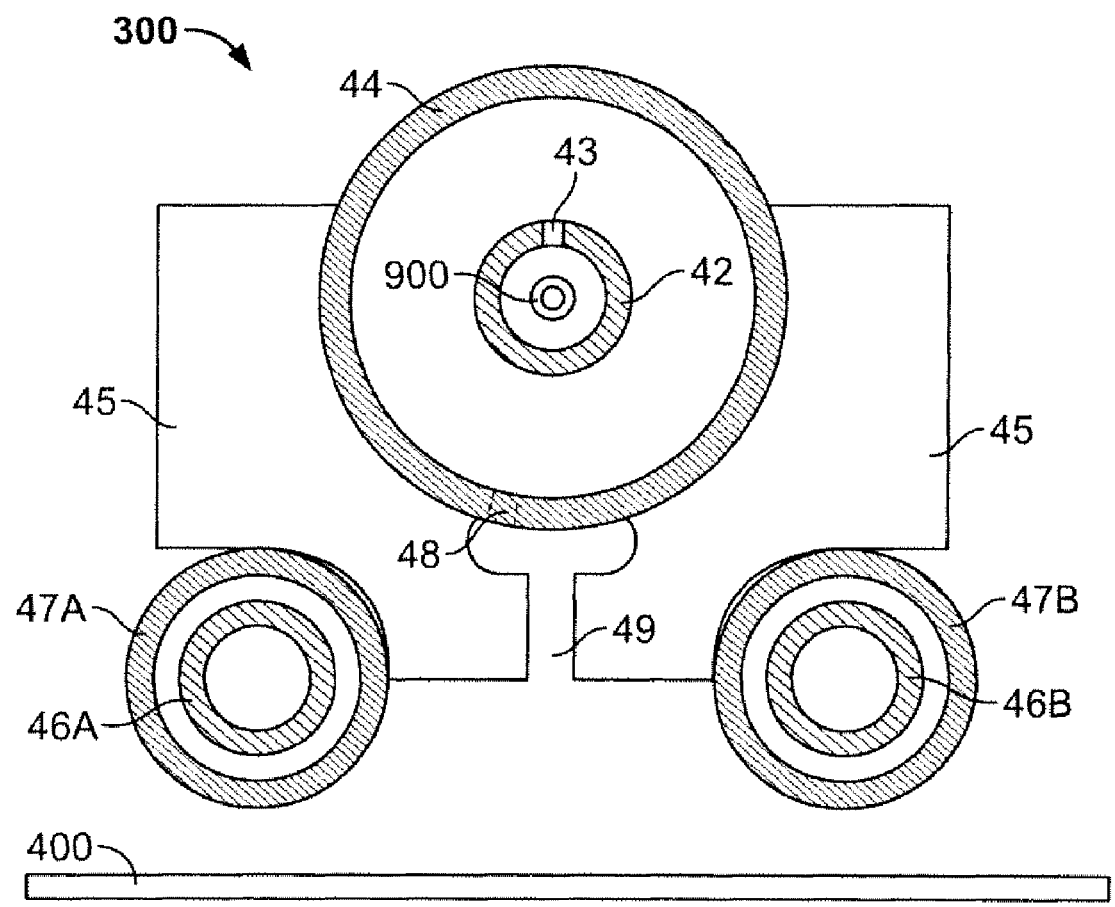
FIG. 6 is a drawing depicting an embodiment of a distributor assembly.

Referring to FIG. 6, one embodiment of distributor assembly 300 is described with reference to its internal components. As described above, a carrier gas and material are introduced into distributor assembly 300 through feed tube 900, which can be formed from mullite, and which can have an outer diameter of about 5 mm to about 15 mm (preferably about 10 mm), and an inner diameter of about 5 mm to about 10 mm (preferably about 6 mm). Carrier gas and material are first directed into the interior of a first chamber, heater tube 42, which can be impermeable and can have an outer diameter of about 15 mm to about 54 mm (preferably about 19 mm), and an inner diameter of about 10 mm to about 15 mm (preferably about 13 mm). Heater tube 42 can be formed from graphite or silicon carbide (SiC), and can be resistively heated by applying a current across heater tube 42. When the material introduced into the interior of heater tube 42 is a cadmium chalcogenide material, heater tube 42 can be heated to a temperature of about 500 degrees C. to about 1200 degrees C. to vaporize the cadmium chalcogenide. If heater tube 42 is formed from graphite, heater tube 42 can be heated to a temperature of about 1200 degrees to about 1500 degrees C. when the material is a cadmium chalcogenide. This higher temperature vaporizes cadmium chalcogenide material more quickly. Forming heater tube 42 from graphite allows higher temperatures to be utilized since it provides resistance against deterioration potentially caused by the vapor in this temperature range.

As new material and carrier gas are introduced into heater tube 42, the vapor and carrier gas are directed out of heater tube 42 through outlet 43, which can be a single hole, and which can have diameter of about 2 mm to about 20 mm (preferably about 3 mm), into a second chamber, distribution manifold 44. Outlet 43 can also represent a plurality of distribution holes. Distribution manifold 44 can be composed of graphite or mullite, or another suitable ceramic, and can have an outer diameter of about 75 mm to about 100 mm (preferably about 86 mm) and an inner diameter of about 50 mm to about 80 mm (preferably about 70 mm).

Distribution manifold 44 is positioned above glass substrate 400 by a cradle 45, which can be formed from graphite, such that the length of distribution manifold 44 covers at least a portion of the width of substrate 400 as substrate 400 is conveyed beneath distribution manifold 44. The vapor and carrier gas travel within and along the length of distribution manifold 44 until the vapor and carrier gas form a uniform vapor/carrier gas composition. Next, the uniform vapor/carrier gas composition is directed out of distribution manifold 44 through a plurality of distribution holes 48 aligned in a row along the length of distribution manifold 44. Distribution holes 48 can number about 20 to about 50 and can have a diameter of about 2 mm to about 5 mm (preferably about 3 mm). The number of distribution holes 48 included in distributor assembly 300 can be varied as required, and can be spaced from about 19 mm to about 25 mm apart. The uniform vapor/carrier gas composition is then directed into a nozzle 49 formed by graphite cradle 45, after which the vaporized semiconductor is deposited on underlying substrate 400, which can be a glass sheet substrate. Directing the uniform vapor/gas composition streams emitted from distribution holes 48 into a portion of cradle 45, as depicted in FIG. 6 disperses the uniform vapor/gas composition and further increases its uniformity of composition, pressure and velocity in preparation for deposition on underlying substrate 400.

As shown in FIG. 6, graphite cradle 45 is adjacent to external heater tubes 46A and 46B, which can be resistively heated silicon carbide (SiC) tubes, and which can have an outer diameter of about 25 mm to about 75 mm (preferably about 54 mm). External heater tubes 46A and 46B can be positioned inside external heater tube shrouds 47A and 47B, which can be formed from mullite. External heater tubes 46A and 46B heat graphite cradle 45. Additionally, after the uniform vapor/carrier gas composition is directed out of nozzle 49, the uniform vapor/carrier gas composition passes proximate to external heater tubes 46A and 46B. Both the heating of cradle 45 and the proximity of external heater tubes 46A and 46B to uniform vapor/carrier gas composition exiting distributor assembly 300 at nozzle 49 maintains the uniform vapor/carrier gas composition at a temperature sufficient to maintain the vapor in a vapor state. A temperature of about 500 degrees C. to about 1200 degrees C. is sufficient to maintain the vapor in a vapor state, where the starting material is a cadmium chalcogenide.

As substrate 400 is conveyed by the orifice of nozzle 49, the uniform vapor/carrier gas composition is directed toward surface of substrate 400, which is maintained at a lower temperature such that the vapor condenses and is deposited on a surface of substrate 400 as a film. The proximity of substrate 400 to nozzle 49 increases the efficiency of depositing the film by reducing the amount of material wasted.

Figure 7:
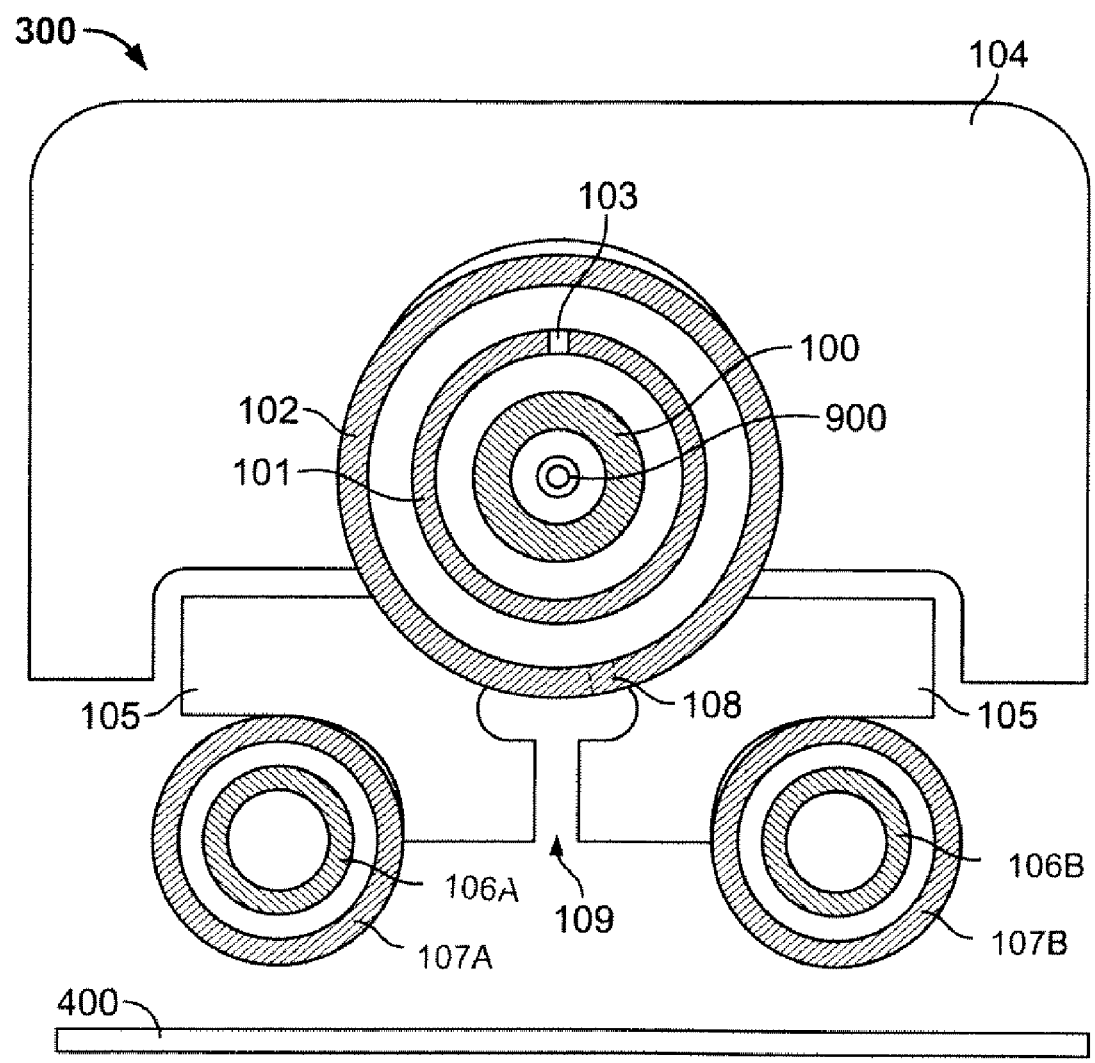
FIG. 7 is a drawing depicting an embodiment of a distributor assembly.

Referring now to FIG. 7, an alternate embodiment of a distributor assembly 300 in accordance with the present invention is depicted. A powder and carrier gas are introduced into the interior of heater tube 100. Heater tube 100 is heated to a temperature sufficient to vaporize the powder as it travels within and along the length of heater tube 100. Heater tube 100 can be resistively heated, and can be formed from SiC. Heater tube 100 is permeable to the vapor and carrier gas, but not to the powder. As the powder is vaporized in heater tube 100, it begins to form a uniform vapor/carrier gas composition with the carrier gas.

The vapor and carrier gas permeate through heater tube 100 into tubular sheath 101, which surrounds heater tube 100 and can be formed from mullite. The vapor and carrier gas are directed within tubular sheath 101, which causes the vapor and carrier gas to continually mix. The vapor and carrier gas are then directed toward outlet 103, which can be a single drilled hole formed in tubular sheath 101. As the vapor and carrier gas are directed through outlet 103, they are remixed even further, contributing to an increasingly uniform vapor/carrier gas composition.

The mixed vapor and carrier gas travel through outlet 103 into the interior of distribution manifold 102, which, like tubular sheath 101, can be formed from mullite or graphite. Distribution manifold 102 may be encased or surrounded by an insulation such as a fiber blanket insulation 104 for retaining heat generated by permeable heated tube 100, thereby reducing the energy required to maintain the temperature required to vaporize the powder. Distribution manifold 102 can be supported by a cradle 105, which can be formed from graphite. Cradle 105 is heated by external heater tubes 106A and 106B, which can be formed from SiC and resistively heated, and located inside external heater tube sheaths 107A and 107B, which can be formed from mullite and which conduct heat generated by external heater tubes 106A and 106B to the adjacent cradle 105.

After the uniform vapor/carrier gas composition is directed through outlet 103 in tubular sheath 101, the vapor and carrier gas continue to mix as they are directed through the space between the interior wall of distribution manifold 102 and the exterior of tubular sheath 101. The uniform vapor/carrier gas composition is directed to a plurality of distribution holes 108 located at a position in distribution manifold 102 substantially opposite the position on tubular sheath 101 at which outlet 103 is located. The plurality of distribution holes 108 can be aligned along at least a portion of the length of distribution manifold 102. The uniform vapor/carrier gas composition is directed through distribution holes 108 toward a portion of graphite cradle 105, dispersing streams of uniform vapor/carrier gas composition directed through distribution holes 108 and further increasing the uniformity of the vapor/carrier gas with respect to composition, pressure, and velocity. In addition to heating graphite cradle 105, external heater tubes 106A and 106B are also proximate to nozzle 109 through which the uniform vapor/carrier gas composition is directed out of distributor assembly 300. Both the heating of cradle 105 and the proximity of external heater tubes 106A and 106B to uniform vapor/carrier gas composition exiting distributor assembly 300 at nozzle 109 maintains the uniform vapor/carrier gas composition at a temperature sufficient to maintain the vapor in a vapor state. A temperature of about 500 degrees C. to about 1200 degrees C. is sufficient to maintain the vapor in a vapor state, where the starting material is a cadmium chalcogenide.

As substrate 400 is conveyed by the orifice of nozzle 109, the uniform vapor/carrier gas composition is directed toward surface of substrate 400, which is maintained at a lower temperature such that the vapor condenses and is deposited on a surface of substrate 400 as a film.

Figure 8:
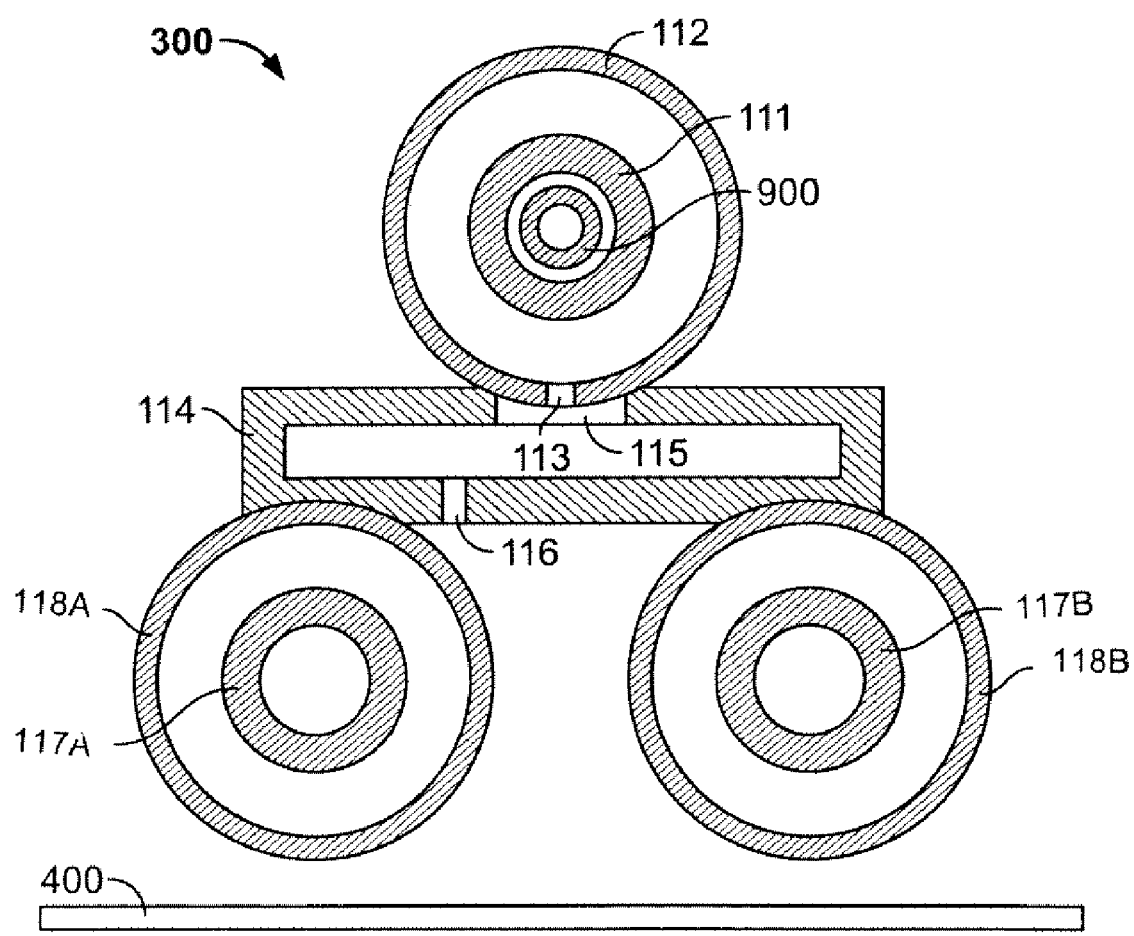
FIG. 8 is a drawing depicting an embodiment of a distributor assembly.

Referring now to FIG. 8, an alternate embodiment of a distributor assembly 300 according to the present invention is depicted. A powder and a carrier gas are introduced into the interior of heater tube 111. Heater tube 111 is heated to temperature sufficient to vaporize the powder as it travels within and along the length of permeable heated tube 111. Heater tube 111 can be resistively heated, and can be formed from SiC. Heater tube 111 is permeable to the vapor and carrier gas, but not to the powder.

The vapor and carrier gas permeate through permeable heater tube 111 into outer tubular sheath 112, which surrounds permeable heater tube 111 and can be formed from mullite. The forming uniform vapor/carrier gas composition is directed within outer tubular sheath 112, which causes the vapor and carrier gas to continually mix. The uniform vapor/carrier gas composition is then directed toward outlet 113, which can be a single drilled hole formed in outer tubular sheath 112. As the semiconductor vapor and carrier gas are directed through outlet 113, they are remixed even further, contributing to an increasingly uniform vapor/carrier gas composition.

The uniform vapor/carrier gas composition is directed through outlet 113 into the interior of manifold 114, which includes a passageway 115 connecting the interior of manifold 114 with outlet 113 formed in outer tubular sheath 112. Manifold 114 is adjacent to external heater tubes 117A and 117B, which can be formed from SiC and resistively heated, and located inside external heater tube sheaths 111A and 118B, which can be formed from mullite and which conduct heat generated by external heater tubes 117A and 117B to the adjacent manifold 114. As the vapor and carrier gas travel within manifold 114, they continue to remix, maintaining a uniform vapor/carrier gas composition.

As new vapor and carrier gas are introduced into the interior of manifold 114 through passageway 115, the uniform vapor/carrier gas composition is directed out of manifold 114 through a plurality of distribution holes 116, which can be arranged in a line parallel to the length of one of the external heater tube sheaths 118A, and is directed such that the flow of the uniform vapor/carrier gas composition is interrupted by external heater tube sheath 118A, which disperses the streams of uniform vapor/carrier gas composition directed from distribution holes 116 and further increases the uniformity of the composition, pressure, and velocity of the vapor/carrier gas. External heater tubes 117A and 117B conduct heat to manifold 114 and are also proximate to the flow of the uniform vapor/carrier gas composition directed out of distribution holes 116. Both the heating of manifold 114 and the proximity of external heater tubes 117A and 117B to uniform vapor/carrier gas composition exiting distributor assembly 300 at distribution holes 116 maintains the uniform vapor/carrier gas composition at a temperature sufficient to maintain the vapor in a vapor state. A temperature of about 500 degrees C. to about 1200 degrees C. is sufficient to maintain the vapor in a vapor state, where the starting material is a cadmium chalcogenide.

External heater tube sheaths 118A and 118B also form a path through which the uniform vapor/carrier gas composition is directed toward a surface of a substrate 400. As substrate 400 is conveyed by the path created by external heater tube sheaths 118A and 118B, the uniform vapor/carrier gas composition is directed toward surface of substrate 400, which is maintained at a lower temperature such that the vapor condenses and is deposited on a surface of substrate 400 as a film.

The embodiments described above are offered by way of illustration and example. It should be understood that the examples provided above may be altered in certain respects and still remain within the scope of the claims. For example, the component dimensions described above are suitable for use with substrates up to 60 cm wide; adjustments can be made when using substrates of different sizes. It should be appreciated that, while the invention has been described with reference to the above preferred embodiments, other embodiments are within the scope of the claims.

What is claimed is:

1. A method for depositing material on a substrate, comprising:
   introducing a material including a powder and a carrier gas into a first chamber including an interior, wherein the first chamber comprises a heater tube within the interior of the first chamber heated by resistive heating to a temperature high enough that at least a portion of the powder vaporizes into a vapor, and wherein the first chamber is permeable to vapor but impermeable to powder, to ensure that powder is unable to pass through the first chamber;
   passing the vapor through the first chamber;
   passing the vapor through at least one outlet connecting the first chamber to a second chamber, wherein the second chamber comprises a distribution manifold at least partially sheathing the first chamber;
   directing a mixture of the vapor and carrier gas through a second chamber to form a substantially uniform vapor/carrier gas composition; and
   directing the substantially uniform vapor/carrier gas composition through a plurality of distribution holes positioned in a line along the length of the second chamber, wherein the substantially uniform vapor/carrier gas composition is directed on a path formed by two external heating elements, wherein the path leads from the second chamber toward a surface of a substrate having a temperature lower than the vapor.

2. The method of claim 1, wherein the material is heated in the first chamber by applying current to a component of the first chamber.

3. The method of claim 2, wherein the material is a cadmium chalcogenide and heating includes maintaining the first chamber at a temperature of at least 500 degrees C.

4. The method of claim 3, wherein the heating includes maintaining the first chamber at a temperature of at least 700 degrees C.

5. The method of claim 1, wherein the external heating elements are heated by applying a current to the external heating elements.

6. The method of claim 1, wherein the material is a cadmium chalcogenide and the external heating elements are maintained at a temperature of at least 500 degrees C.

7. The method of claim 1, wherein the at least one outlet in the first chamber comprises a plurality of distribution holes.

* * * * *

UNITED STATES PATENT AND TRADEMARK OFFICE
CERTIFICATE OF CORRECTION

PATENT NO. : 7,931,937 B2
APPLICATION NO. : 11/380095
DATED : April 26, 2011
INVENTOR(S) : Rick C. Powell It is certified that error appears in the above-identified patent and that said Letters Patent is hereby corrected as shown below:

In the Specification:

Column 8, line 56, "111A" should read "118A"

Signed and Sealed this
Eighth Day of November, 2011

David J. Kappos
*Director of the United States Patent and Trademark Office*